(12) United States Patent
Shan

(10) Patent No.: US 6,913,652 B2
(45) Date of Patent: Jul. 5, 2005

(54) GAS FLOW DIVISION IN A WAFER PROCESSING SYSTEM HAVING MULTIPLE CHAMBERS

(75) Inventor: Hongqing Shan, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 43 days.

(21) Appl. No.: 10/174,243

(22) Filed: Jun. 17, 2002

(65) Prior Publication Data

US 2003/0230239 A1 Dec. 18, 2003

(51) Int. Cl.⁷ .................. C23C 16/00; H01L 21/306; C23F 1/00
(52) U.S. Cl. ............... 118/719; 118/715; 118/723 E; 156/345.26; 156/345.29; 156/345.31; 156/345.32
(58) Field of Search ............... 118/723 E, 719; 156/345.29, 345.31, 345.32; 414/939

(56) References Cited

U.S. PATENT DOCUMENTS

| | | | |
|---|---|---|---|
| 4,949,670 A | * | 8/1990 | Krogh .................. 118/723 E |
| 5,269,847 A | | 12/1993 | Anderson et al. |
| 5,281,295 A | * | 1/1994 | Maeda et al. .......... 156/345.29 |
| 5,453,124 A | | 9/1995 | Moslehi et al. |
| 5,515,986 A | | 5/1996 | Turlot et al. |
| 5,532,190 A | | 7/1996 | Goodyear et al. |
| 5,683,517 A | | 11/1997 | Shan |
| 5,683,548 A | | 11/1997 | Hartig et al. |
| 5,702,530 A | | 12/1997 | Shan et al. |
| 5,804,695 A | | 9/1998 | Dageforde |
| 5,855,681 A | | 1/1999 | Maydan et al. |
| 5,948,168 A | | 9/1999 | Shan et al. |
| 5,980,686 A | | 11/1999 | Goto |
| 6,062,246 A | | 5/2000 | Tanaka et al. |
| 6,062,256 A | | 5/2000 | Miller et al. |
| 6,083,344 A | | 7/2000 | Hanawa et al. |
| 6,090,210 A | | 7/2000 | Ballance et al. |
| 6,143,082 A | * | 11/2000 | McInerney et al. ......... 118/719 |
| 6,176,667 B1 | | 1/2001 | Fairbairn et al. |
| 6,224,680 B1 | | 5/2001 | Toshima |
| 6,273,955 B1 | * | 8/2001 | Yoshino et al. ............ 118/718 |
| 6,294,026 B1 | | 9/2001 | Roithner et al. |
| 6,333,272 B1 | | 12/2001 | McMillin et al. |
| 6,365,229 B1 | * | 4/2002 | Robbins .................. 427/248.1 |
| 6,630,053 B2 | * | 10/2003 | Yamagishi et al. .... 156/345.32 |
| 2002/0033136 A1 | * | 3/2002 | Savage et al. ............. 118/719 |

* cited by examiner

Primary Examiner—Parviz Hassanzadeh
Assistant Examiner—Karla Moore
(74) Attorney, Agent, or Firm—Townsend & Townsend & Crew; Joseph Bach

(57) ABSTRACT

A system for processing substrates includes a first process chamber configured to perform a given process on a first substrate. A second process chamber is configured to perform the same process as the first chamber on a second substrate. A gas source system is configured to output a process gas. A gas flow system includes a flow channel coupled to the gas source system and the first and second process chambers to provide the process gas into the first and second process chambers. The gas source system further includes a gas flow controller to regulate flow rates of the process gas provided into the first and second chambers in order to provide the first and second substrates with substantially uniform process results.

15 Claims, 8 Drawing Sheets

GAS FLOW DIVISION IN A WAFER PROCESSING SYSTEM HAVING MULTIPLE CHAMBERS

BACKGROUND OF THE INVENTION

The present invention relates to equipment for processing semiconductor wafers, and in particular to a method and apparatus for processing two or more wafers at the same time in two or more processing chambers.

Numerous techniques and apparatus are well known for use in the processing of semiconductor wafers to make integrated circuits. The state of the art fabrication facilities (known as "fabs") for carrying out such processes are typically large buildings within which "clean rooms" of thousands of square feet of floor area are provided. The clean rooms contain the equipment within which the various semiconductor fabrication processes are carried out, for example, chemical vapor deposition equipment for deposition of conductive or insulative materials on the wafers, ion implantation equipment for introduction of impurities into the wafers, furnaces for heating the wafers, plasma etchers for removing material from the wafers, etc.

Compared even to their recent predecessors, clean rooms today are extraordinarily clean, often having particle densities of less than class 1. Such low particle densities require expensive equipment to purify the air in the clean room, as well as unusual care in all other respects. The result of these measures is that floor space in such clean rooms is expensive. The per-square-foot construction cost, as well as maintenance cost, is high.

Another trend in the manufacture of integrated circuits is the use of single wafer processing equipment. In single wafer equipment, processing is carried out on the wafers one wafer at a time. That is, one wafer is introduced from a cassette holding many wafers into the processing chamber. The necessary process on the wafer is carried out in the chamber, then the wafer is removed from the chamber and the next wafer introduced. Typically, such single wafer processing chambers are clustered around a central robot which can load the chambers with individual wafers. The use of single wafer processing provides higher yields by making the process more controllable across the entire wafer, typically 8 inches in diameter, with 12 inches in the near future. The higher yields produced by single wafer systems have resulted in their use in many of the advanced fabrication facilities used today in the semiconductor industry.

BRIEF SUMMARY OF THE INVENTION

Embodiments of the present invention pertain to a method and apparatus for processing two or more wafers at the same time in two or more processing chambers. In one embodiment, a system for processing substrates includes a first process chamber configured to perform a given process on a first substrate. A second process chamber is configured to perform the same process as the first chamber on a second substrate. A gas source system is configured to output a process gas that includes gases from at least two different gas sources. A gas flow system includes a flow channel coupled to the gas source system and the first and second process chambers to provide the process gas into the first and second process chambers. The gas source system further includes a gas flow controller to regulate flow rates of the process gas provided into the first and second chambers in order to provide the first and second substrates with substantially uniform process results.

In another embodiment, a system for processing substrates includes a first process chamber configured to perform a given process. A second process chamber is configured to perform the same process as the first chamber and provided over the first process chamber. A gas source includes a process gas. A gas flow system has a flow channel coupled to the gas source and the first and second process chambers to provide the process gas into the first and second process chambers. A gas flow controller system includes a first input port to receive the process gas, a first extending channel coupled to the first input port, a first output port coupled to the first extending channel and configured to output the process gas to the first process chamber, and a first flow controller coupled to the first extending channel to regulate a flow rate of the process gas flowing through the first extending channel.

In another embodiment, a system for processing substrates includes a first process chamber configured to perform a given process. A second process chamber is configured to perform the same process as the first chamber and provided over the first process chamber. A cathode assembly is shared by the first and second chambers. A gas source is configured to output a process gas. A gas flow system has a flow channel coupled to the gas source and the first and second process chambers to provide the process gas into the first and second process chambers. A gas flow controller system includes first and second input ports to receive the process gas, first and second extending channels coupled to the first and second input ports, first and second output ports coupled to the first and second extending channels and configured to output the process gas to the first and second process chambers at first and second flow rates, and a flow controller coupled to the first and second extending channel to control the first and second flow rates.

In yet another embodiment, a method of processing a plurality of substrates includes inserting a first substrate into a first chamber to perform a given process. A second substrate is inserted into a second chamber to perform the same process as in the first chamber. A process gas received from a gas source is divided into a first input gas directed to the first chamber and a second input gas directed to the second chamber. A first flow rate of the first input gas and a second input rate of the second input gas are different from each other to promote process uniformity between the first and second chambers.

DETAILED DESCRIPTION OF THE INVENTION

Figure 1:
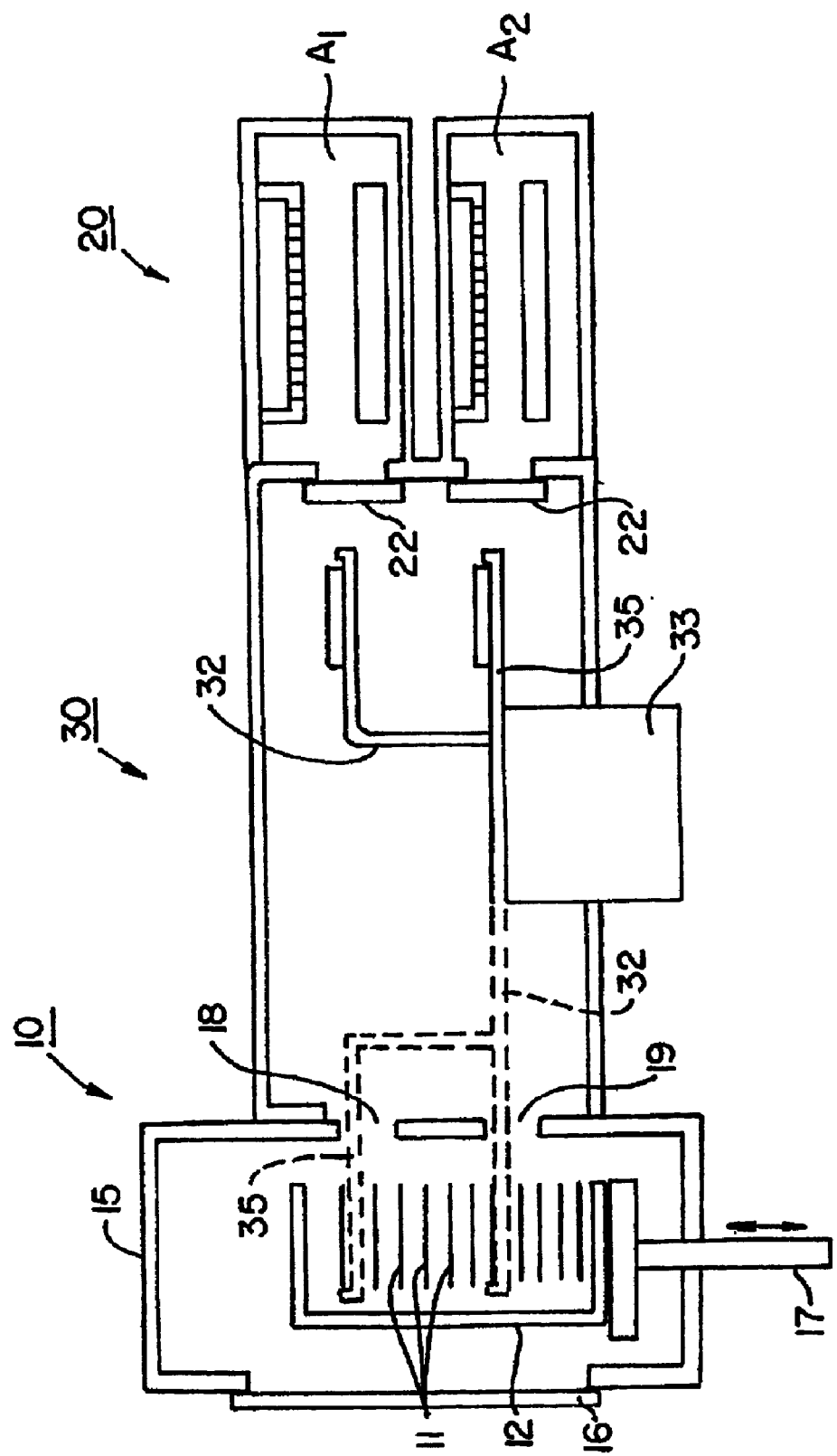
FIG. 1 is a cross-sectional view of a multideck wafer processing system according to one embodiment of the present invention.

FIG. 1 is a cross-sectional view of a multideck wafer processing system. The system shown in FIG. 1 includes a wafer storage mechanism 10 in which a group of wafers is stored, typically on the order of 4 to 100 wafers. Also shown in FIG. 1 are a pair of wafer processing chambers A1 and A2 situated generally in a chamber stack 20. Importantly, as will be discussed below, the pair of processing chambers is disposed one above the other. Each chamber provides the capability of processing one or more wafers therein. Between the wafer processing chambers A1 and A2 and the wafer storage mechanism 10 is positioned a wafer transfer chamber 30. Wafer transfer chamber 30 is adapted to transfer wafers from storage mechanism 10 and place those wafers in the processing chambers. Each of these elements of the system is discussed in further detail below.

In the fabrication of integrated circuits using silicon wafers, or other type semiconductor wafers, the wafers typically are provided to the processing apparatus in a wafer cassette 12. Wafer cassette 12 is usually a plastic, metal, or ceramic material in which the wafers are positioned in slots adjoining each other. Each slot includes protrusions to maintain each wafer in a separate spaced apart position from the adjoining wafers. A loadlock 15 typically includes an openable door 16 and an elevator 17 upon which the cassette rides. The loadlock also includes additional openings 18 and 19 on one side thereof. These openings enable a robot arm 32 to reach into the cassette and remove wafers 11.

In operation, a cassette 12 is placed in loadlock 15 and door 16 is closed. At this time doors 18 and 19 also will be closed. Tubing, or other suitable interconnection piping, couples the loadlock 15 to a vacuum pump (shown in FIG. 3). After the cassette is introduced and door 16 closed, the vacuum pump is engaged and the pressure within the loadlock reduced to a pressure corresponding to that in wafer transfer chamber 30. The doors over openings 18 and 19 then are opened to enable robot arm 32 to extract wafers from cassette 12. The remainder of the semiconductor fabrication operation is then carried out without the need for reopening the loadlock. Once the entire cassette of wafers has been processed, the loadlock is vented to atmospheric pressure; door 16 is opened; the completed cassette is removed; and a new cassette is introduced. In other embodiments the system described can be employed to perform processes at atmospheric pressure, or at higher than atmospheric pressures. In such cases the vacuum pump may be replaced by other pumps which provide the desired process pressure.

As mentioned, also coupled to wafer transfer chamber 30 are a series of processing chambers 20. These processing chambers are shown on the right-hand side of FIG. 1 and are designated chamber A1 and chamber A2. Although only two vertically arranged processing chambers are shown in FIG. 1, it should be appreciated that as many as desired may be stacked vertically. For example, described below is an embodiment in which three vertically arranged processing chambers are provided.

In one embodiment, the processing chambers (e.g., chamber A1 and A2) include identical components and are adapted to carry out identical semiconductor processing operations, or identical sets of processing operations. For example, the semiconductor processing chambers may include identical cathode assemblies, chamber walls and liners, lids or ceilings, gas injectors, pumping locations and surface temperature controls. Also, the chambers may have identical volumes. Being identically configured allows the chamber to simultaneously perform identical chemical vapor deposition operations in which an insulating or a conductive material is deposited on a wafer disposed in each respective chamber. In other embodiments, the identical semiconductor processing chambers are used for etching of the wafers, typically through openings in a photoresist or other type of masking layer. Of course, any suitable semiconductor operation can be performed simultaneously in each of these chambers, such as plasma vapor deposition, epitaxial layer deposition, etc. As will be described, the choice of such operation is arbitrary within the context of the system described herein. For illustration of a typical process, the chambers depicted in FIG. 1 include schematic illustrations of a "showerhead" used for chemical vapor deposition, and a wafer heater, upon which the wafer is positioned for processing.

Wafer transfer chamber 30 is provided between the vertically arranged wafer processing chambers 20 and loadlock 15. The wafer transfer chamber includes a robot 33 which moves an arm 32 among a series of desired positions. In FIG. 1 the arm is shown in two different positions. In the first position on the left-hand side of the figure, the arm is in position to extract two wafers 11 from cassette 12. (In embodiments where more than one wafer per chamber are processed, the robot may handle multiple wafers in one, or a few, procedures.) Support fingers 35 extend from arm 32 beneath the wafers. These fingers have been inserted into the gap between the adjoining wafers, and the robot arm lifted slightly to the point where the weight of the wafers bears on the support fingers of the arm.

As the operation continues, the arm will move to a second position, shown generally on the right-hand side of wafer transfer chamber 30. The wafers are placed in the second position by activation of robot 33 which moves arm 32 and support fingers 35 into the desired position. In this position the wafers are resting on the support fingers. This is in preparation for the two slit valves 22 to be opened to permit the wafers to be moved into the processing chambers. Because the loadlock and the wafer transfer chamber are maintained at essentially the same pressure, minimal or no use of the vacuum pump for the transfer operation is needed.

Once the wafers are in the position shown on the right-hand side of wafer transfer chamber 30, slit valves 22 may be opened and the wafers inserted into the processing chambers, again using robot 33. If the chambers are single wafer chambers, a desired process is then carried out on the wafers. On the other hand, if either or both chambers is designed for handling more than one wafer at a time, then additional wafers are inserted and the desired process carried out. Ultimately the wafers are removed from the processing chambers and returned to the cassette. Another set of wafers is then removed from the cassette and inserted into the processing chambers. This process is repeated until all of the wafers in the cassette have been processed, and then a new cassette is introduced and the process repeated again. Of course, if multiple loadlocks are available, then a cassette from another loadlock can be used as a source of wafers while the loadlock depicted is refilled.

While the use of a single robot with the capability of handling two or more wafers at a time is depicted, in some embodiments multiple robots are used. This is advantageous for situations in which the chambers are to be loaded at different times, for example, if two different processes are being performed, one in each of the stacked chambers.

Figure 2:
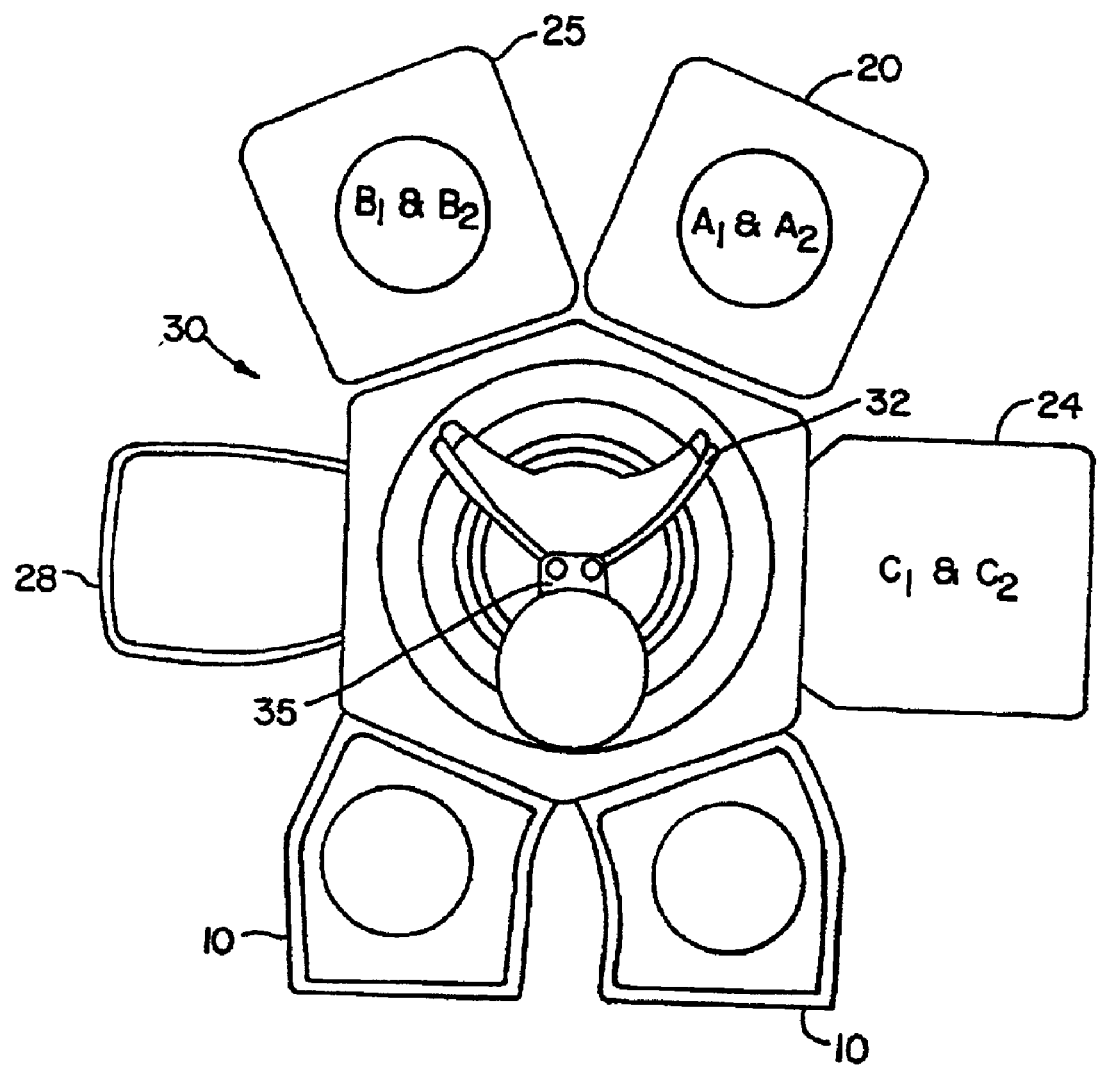
FIG. 2 is a top view of the system shown in FIG. 1.

FIG. 2 is a plan or top view of a multideck wafer processing system. FIG. 2 represents the appearance of a typical system when viewed from above. In the system shown in FIG. 2, two loadlocks 10 are provided, each with its own chamber for storing a cassette and elevating the cassette up and down to enable the wafers to be removed from the cassette by arm 32 and supports 35. As shown the loadlocks are coupled to wafer transfer chamber 30 where the robot is situated. Coupled around the periphery of wafer transfer chamber 30 are the desired wafer processing chambers. For example, wafer processing chambers A1 and A2 shown in FIG. 1 are shown near the upper portion of FIG. 2, while additional chambers 24 and 25 are shown adjoining chambers 20. The additional chambers each include a stacked pair of chambers as shown in FIG. 1. For example, chambers 25 consists of vertically arranged chambers B1 and B2, while the chambers 24 consists of vertically arranged chambers C1 and C2. Of course, more or fewer chambers, whether stacked or single, can be included as desired. Also shown in FIG. 2 is a multiwafer cool-down chamber 28 to allow the wafers to cool after being removed from the processing chambers and before being reintroduced into the cassettes in the loadlocks. Importantly, as evident from FIG. 2, the footprint of the overall wafer processing system depicted is the same size as those systems where only a single tier of wafer processing chamber is used. Thus, as shown by FIG. 2, six processing chambers are provided in the same area of fab floor space as a prior art system with three processing chambers.

The use of two loadlocks as depicted in FIG. 2 enables one loadlock to be an active loadlock for use by the processing equipment, while a new supply of wafers is introduced into the other loadlock and the pressure lowered to the desired level. By the time a first cassette is completely processed from the first loadlock, a second cassette in the second loadlock will be ready for processing. In this manner, the completed first cassette can be removed from the first loadlock, and a third cassette introduced for processing. This improves the efficiency of the system.

Figure 3:
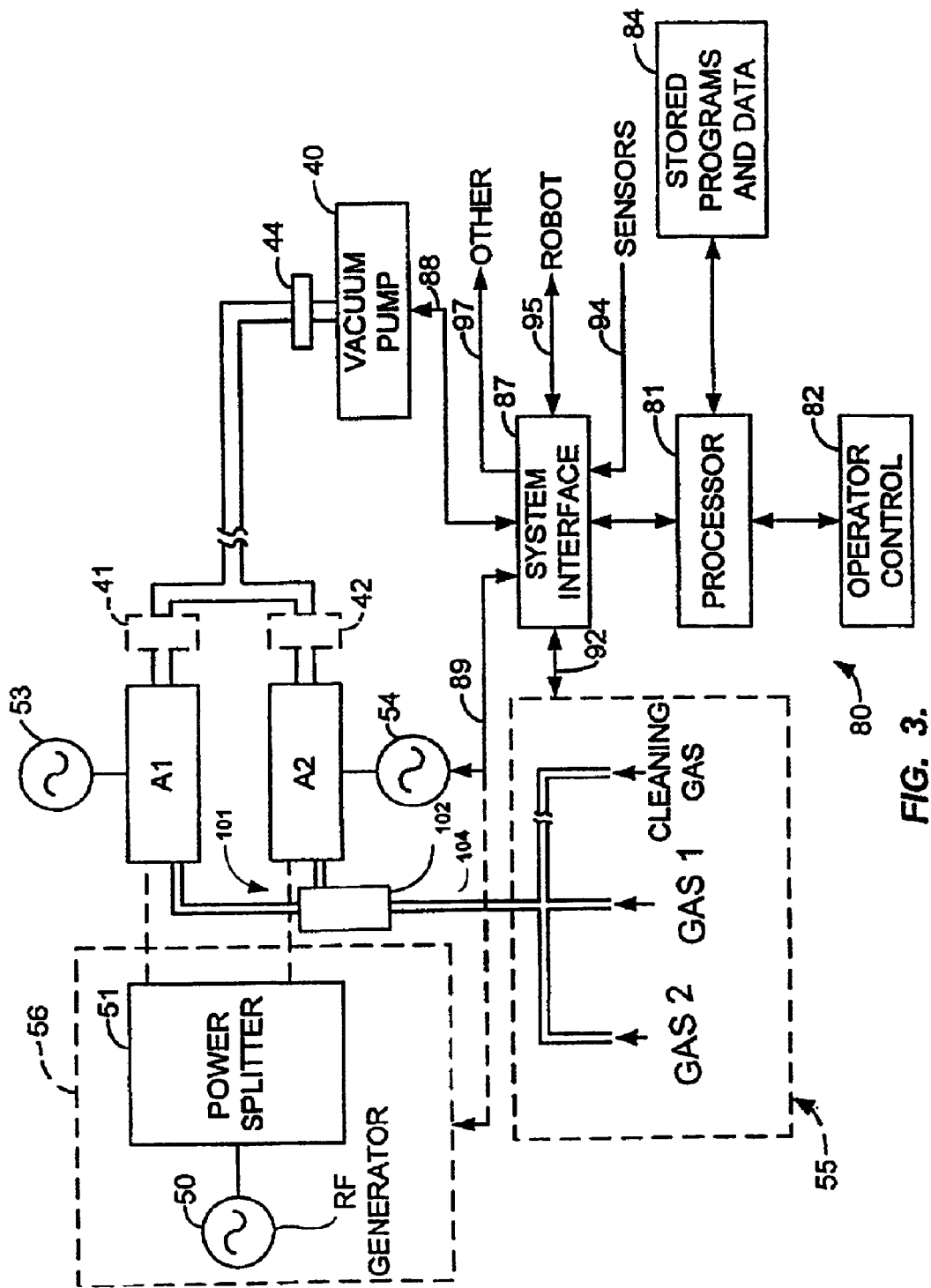
FIG. 3 is a schematic diagram illustrating a typical vacuum, RF, and process gas supply system, as well as a control system, for the apparatus shown in FIGS. 1 and 2.

FIG. 3 illustrates additional aspects of some embodiments of the invention described herein. The use of vertically stacked multiple chamber systems enables shared use of one or more of a radio frequency system, a vacuum pumping system, a process gas system, and a control system. That is, each of these systems can be shared by the vertically arranged chambers. For example, in FIG. 3 a single vacuum pumping set 40 is provided. This is coupled through a single throttle valve 44 to both chambers A1 and A2. In another embodiment vacuum pumping set 40 is coupled through two throttle valves 41 and 42 to the two chambers A1 and A2, one above the other. To illustrate this alternative embodiment, the two throttle valves are shown schematically with dashed lines.

Depicted schematically in FIG. 3 is a representation of a control system 80 for controlling the multideck single wafer processing system. Control system 80 includes a processor 81 coupled to an operator control system 82 and to a memory 84. Processor 81 and operator control system 82 include known components. The operator of the wafer processing system typically enters commands using, for example, a keyboard or other apparatus in operator control system 82. Under direction of these commands processor 81 will use the programs and data stored in memory 84 to carry out desired wafer processing steps.

In one embodiment processor 81 is connected to supply commands to the wafer processing system through a suitable interface 87. Interface 87 is connected, in turn, to the vacuum system through a bus or other connection 88 which enables processor 81 to provide desired instructions to the vacuum system and receive information from it. Other similar interconnections 89, 92 and 95 enable the processor to control the RF generator(s), the process gas system, and the robot handling wafer movement. Of course, sensors may provide information to the processor via connections 94 to the system interface. In addition, other desired equipment may be coupled to processor 81 by a suitable connection 97 to the system interface. In the manner depicted, control system 80 is able to control the operations of the multideck single wafer processing system.

To improve operation, in one embodiment separate RF generators 53 and 54 are used, one for each chamber. In an alternate embodiment, illustrated within block 56, a single RF generator 50 is coupled through a power splitter 51 to each of the two chambers. Furthermore, a single gas supply 55 for the deposition or other process gas, as well as the cleaning gas, is provided and shared by both chambers via a flow channel 101. A gas flow controller or gas flow divider 102 is coupled to the flow channel 101 to regulate the gas flow into the chambers.

Figure 4:
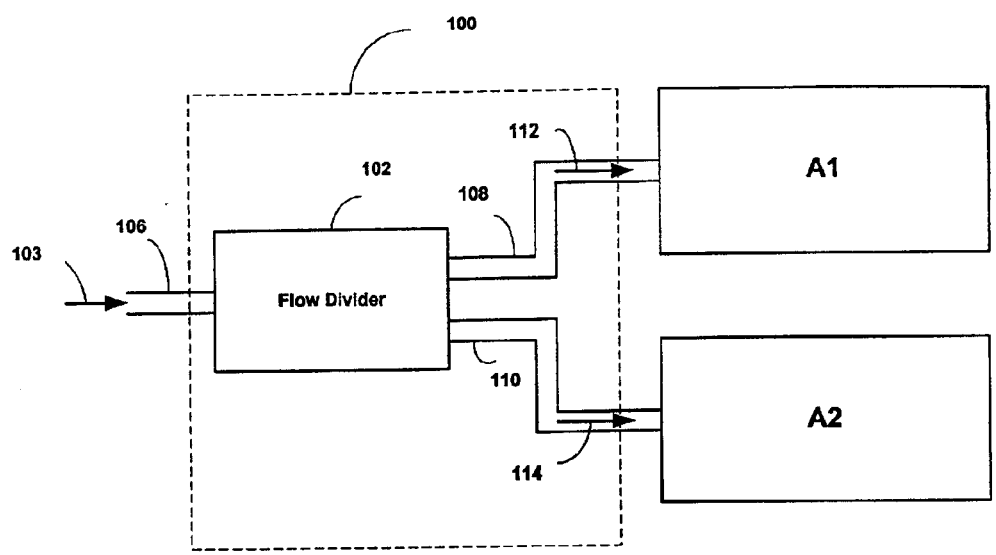
FIG. 4 is a schematic diagram illustrating a gas flow control system including a flow divider according to one embodiment of the present invention.

Referring to FIG. 3, gas supply 55 outputs a mixed gas or process gas 103 (FIG. 4), which depending on the operation performed in chambers A1 and A2 may include one or more gases selected from gas sources Gas 1, Gas 2 and Gas 3 shown in FIG. 3. The process gas is directed from gas supply 55 through an output port 104 at a given flow rate (or input flow rate) that is suitable for the process being performed in the chambers A1 and A2. Referring to FIG. 4, a gas flow control system 100 including the flow divider 102 receives the mixed gas via an input flow channel 106 and outputs the mixed gas to a first output channel 108 and a second output channel 110. That is, the mixed gas 103 is divided into a first input gas 112 and a second input gas 114 and provided into the first chamber A1 and the second chamber A2, respectively, via the output channels 108 and 110.

In one embodiment, the two chambers A1 and A2 are designed with substantially the same configuration, so that two substrates may be treated with the same process within the chambers simultaneously. For example, both of the chambers may be configured to perform a plasma enhanced chemical vapor deposition, pad etch, etch back, or spacer etch process. In operation, the first and second substrates are inserted into the chambers A1 and A2, respectively, using the robot 33 (FIG. 1). The robot has two support fingers or blades 35 to transfer the substrates from the cassette 12 into the two chambers A1 and A2 at the same time. Alternatively, the robot may have a single support finger and perform the transfer operation twice to transfer the substrates into the two chambers.

The two chambers A1 and A2 are provided with substantially the same configuration to obtain process uniformity between the chambers. For example, identical cathode assemblies, chamber walls, gas injectors and the like are used in each chamber. Also, the gas input port, gas output port, substrate support pedestal, and the like are provided at the same relative locations in the two chambers. In one embodiment, the cathode assemblies or vacuum pump, or both are not shared by the two chambers.

In addition, substantially the same process parameters are used for the two chambers A1 and A2. The first input gas 112 directed to the first chamber A1 and the second input gas 114 directed to the second chamber A2 comprise the same gas composition since they are divided from the mixed gas 103. The flow divider 102 is configured to divide the mixed gas 103. In one embodiment, the mixed gas 103 is divided evenly between the first input gas and the second input gas.

In another embodiment, the flow divider 102 divides the mixed gas 103 controllably, so that either the first input gas 112 or the second input gas 114 has a slightly higher flow rate than the other. This unequal gas division may be used to compensate for any process differences in the two chambers resulting from slight configuration differences (whether intentional or unintentional), finite pumping conductance differences, and the other factors that negatively affects the process uniformity between the chambers.

There are many ways to determine the desired gas flow rates for the first and second input gases 112 and 114 for the desired process uniformity. One method is to perform one or more test runs. After each test run, the processed substrates may be examined to determine whether significant non-uniformity exists. If so, a user or computer may adjust the flow rates accordingly. Thereafter, the subsequently processed substrates is examined, and so on until appropriate flow rates have been determined for the first and second input gases. Alternatively, where there has been an intentional chamber design variance, a user or computer may calculate the effect of this design difference and set the flow rates accordingly. Of course, the above two methods may be used together where appropriate.

Figure 5:
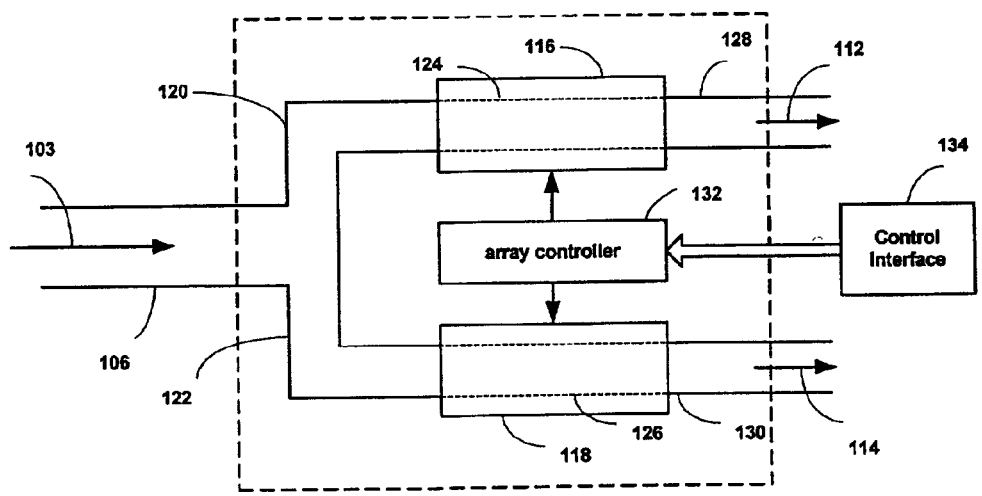
FIG. 5 is a schematic diagram illustrating the flow divider of FIG. 4 in more detail.

In one embodiment, the flow divider 102 is a programmable flow divider that may be remotely controlled (FIG. 5). The gas flow divider 102 includes a first flow regulator 116 and a second flow regulator 118 that cooperate together to regulate the flow rates of the first input gas 112 and second input gas 114 outputted by the flow divider 102. The flow divider 102 includes a first divider input port 120 and a second divider input port 122. Both are coupled to the input flow channel 106 to receive the mixed or process gas 103. A first elastic channel 124 and a second elastic channel 126 coupled to first and second divider input ports 120 and 122, respectively, extend through the first and second regulators 116 and 118. First and second divider output ports 128 and 130 are coupled to the first and second elastic channels 124 and 126, respectively, to output the first and second input gases 112 and 114.

A flow dividing controller 132 is electrically coupled to the flow regulators 116 and 118 to facilitate instantaneous control of the flow regulators. The flow dividing controller may be provided within the flow divider, as shown in FIG. 5 or at an external location. A control interface 134 is provided at a remote location from the flow divider 102 to provide easy user access. The control interface may be a keyboard, a touch pad, a mechanical actuator, or other suitable input device for inputting the desired flow rates, as explained in more detail below.

In operation, when a user inputs a command using the control interface, flow dividing controller 132 sends appropriate signals to the flow regulators. As a result, the flow regulators 116 and 118 controls the flow rates of the first and second input gases 112 and 114 by applying appropriate levels of pressure to the first and second elastic channels 124 and 126 extending therethrough. For example, if the user transmits a command to provide first input gas 112 with a higher flow rate than that of second input gas 114, second flow regulator 118 applies a greater pressure to the second elastic channel than the pressure being applied to the first elastic channel by the first flow regulator. In one embodiment, for this purpose, the regulator has one or more movable plates or objects (not shown) that apply the necessary pressure on the elastic channel according to the signals from the array controller. In the above example, the flow channels within flow divider 102 are assumed to be the same for the two paths in question.

Of course, the flow channels may be provided with different cross-sectional area in other embodiments. For example, if the two chambers are intentionally configured with different designs, e.g., one is provided with a greater chamber volume, then one set of the flow channels within the flow divider may be provided with a greater cross-sectional area as a coarse tuning mechanism. Additionally, the flow regulators may be used as a fine tuning mechanism.

Figure 6:
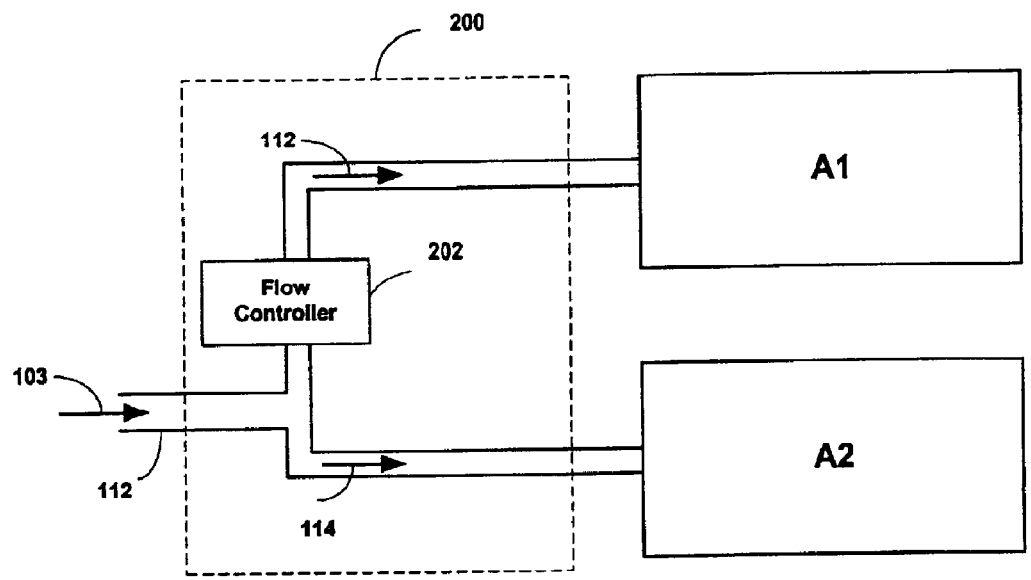
FIG. 6 is a schematic diagram illustrating a gas flow control system including a flow controller according to one embodiment of the present invention.
Figure 7:
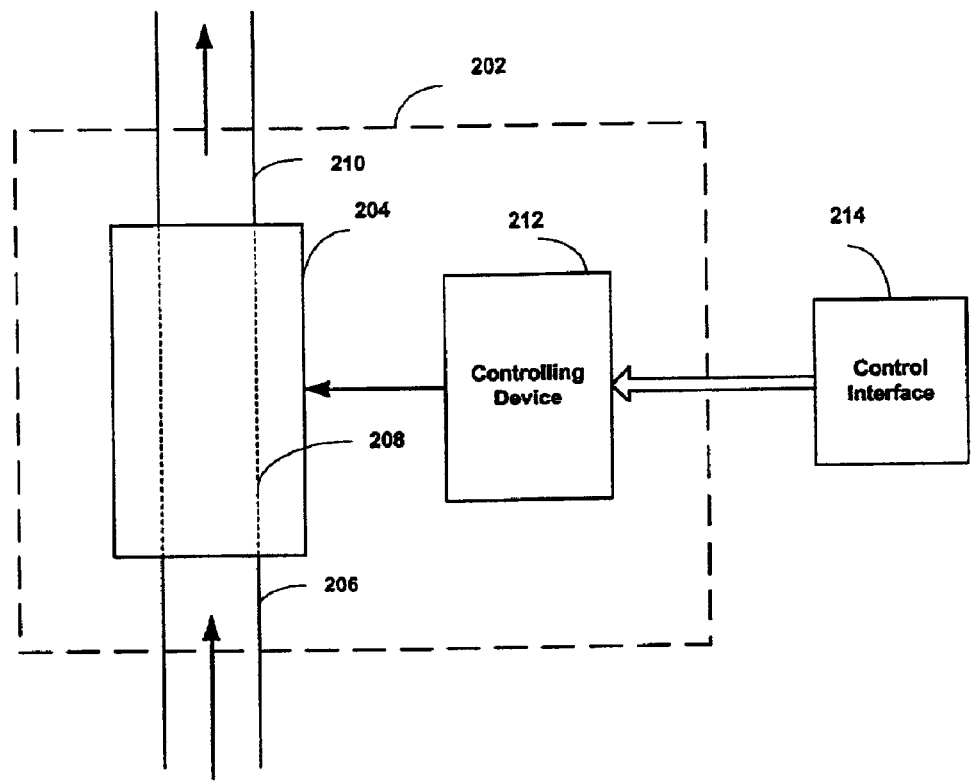
FIG. 7 is a schematic diagram illustrating the flow controller of FIG. 6 in more detail.

FIGS. 6 and 7 illustrates a flow control system 200 including a flow controller 202 that is coupled to first output channel 108 to regulate the flow rates of first and second input gases 112 and 114. Flow controller 202 includes a flow regulator 204, a first controller input port 204 that is coupled to the input flow channel 206, an elastic channel 208 extending through the flow regulators 204, and a controller output port 210 coupled to the elastic channel 208.

A controlling device 212 is electrically coupled to the flow regulator 204 to facilitate instantaneous control of the flow regulator. Device 212 is coupled to a control interface 214 and transmits control signals to regulator 204. The control interface may be any suitable input device, e.g., a keyboard, a touch pad, or a mechanical actuator.

In operation, when a user inputs a command using the control interface, device 212 sends appropriate control signals to the flow regulator. As a result, the flow regulator directly adjusts or controls the flow rate of first input gas 112 by applying an appropriate level of pressure to elastic channel 208 extending therethrough. The change in the flow rate of first input gas 112 causes a corresponding change (i.e., inverse proportional change) in the flow rate of second input gas 114 since the total flow rate of the mixed gas 103 is divided between the first and second input gases. For example, if the user transmits a command to increase the flow rate of first input gas 112, the flow regulator 204 is controlled to apply less pressure on the elastic channel 208. This would increase the flow rate of the first input gas 112 (direct control), which causes the flow rate of the second input gas to decrease (indirect control).

Figure 8:
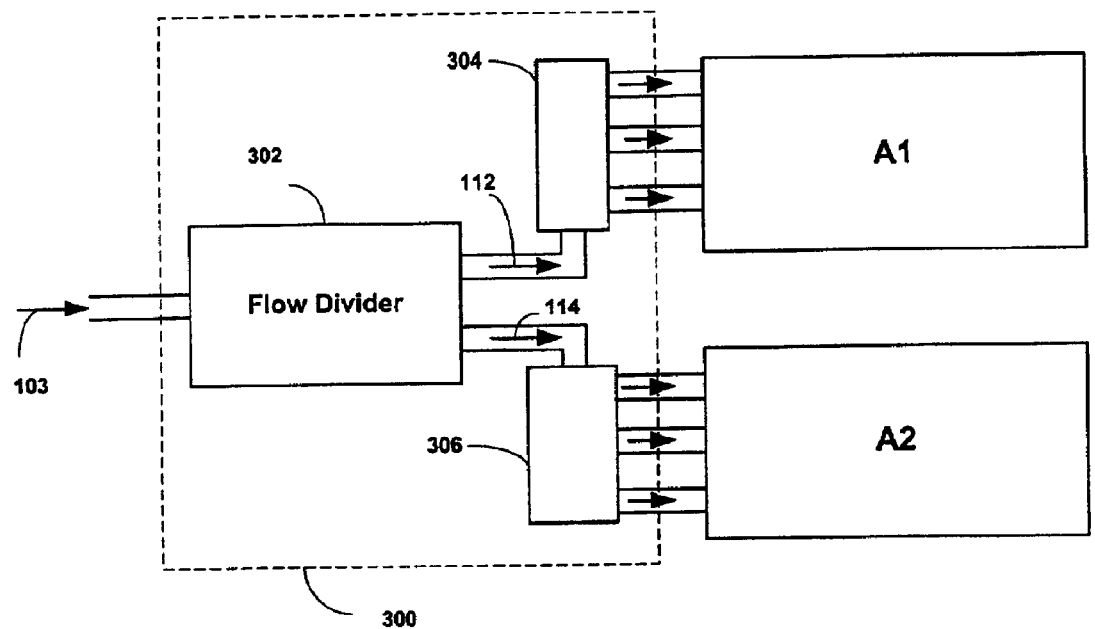
FIG. 8 is a schematic diagram illustrating a gas flow control system including one or more secondary flow dividers according to one embodiment of the present invention.

FIG. 8 illustrates a flow control system 300 including a primary flow divider 302, a first secondary flow divider 304, and a second secondary flow divider 306. The primary flow divider 302 corresponds to flow divider 102 of FIG. 4. Secondary flow dividers 304 and 306 receive first and second input gases 112 and 114, respectively, and divide them into a plurality of gas flows prior to inputting them into chambers A1 and A2. Input gases 112 and 114 are divided, respectively, into multiple gas flows, so that they may be more uniformly distributed into the chambers to provide better process uniformity, as explained in U.S. Pat. No. 5,683,517, which is incorporated by reference for all purposes.

Figure 9:
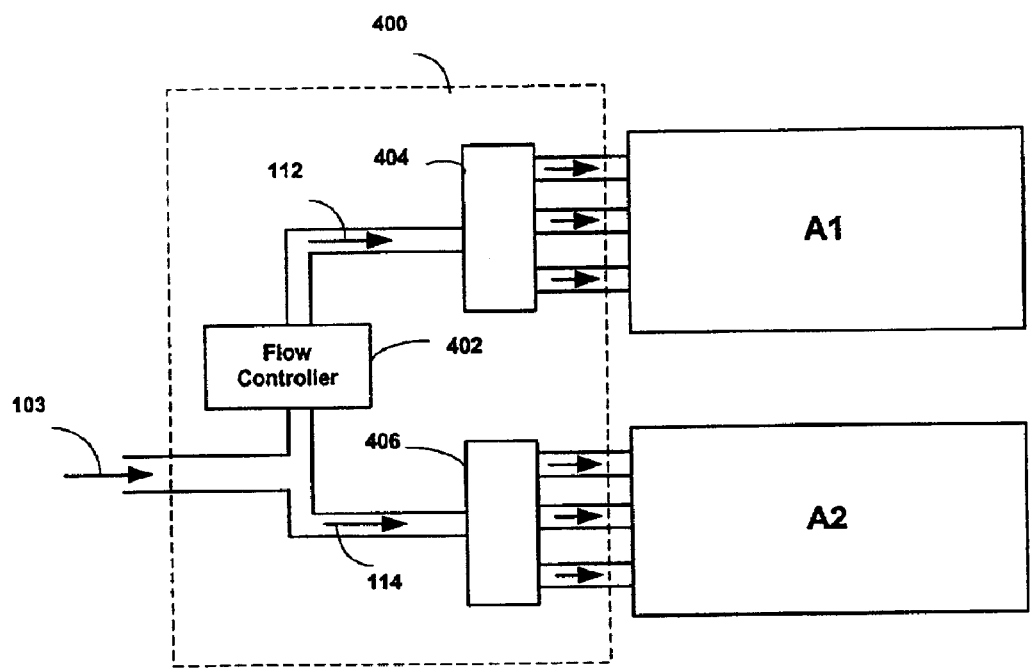
FIG. 9 is a schematic diagram illustrating a gas flow control system including one or more secondary flow dividers according to another embodiment of the present invention.

FIG. 9 illustrates a flow control system 400 including a primary flow controller 402, a first secondary flow divider 404, and a second secondary flow divider 406. The primary flow controller 402 corresponds to the flow controller 202 of FIG. 6. As with secondary flow dividers 304 and 306, flow dividers 404 and 406 are provided to divide input gases 112 and 114, respectively, into multiple gas flows in order to more uniformly distribute the gases into the chambers.

Figure 10:
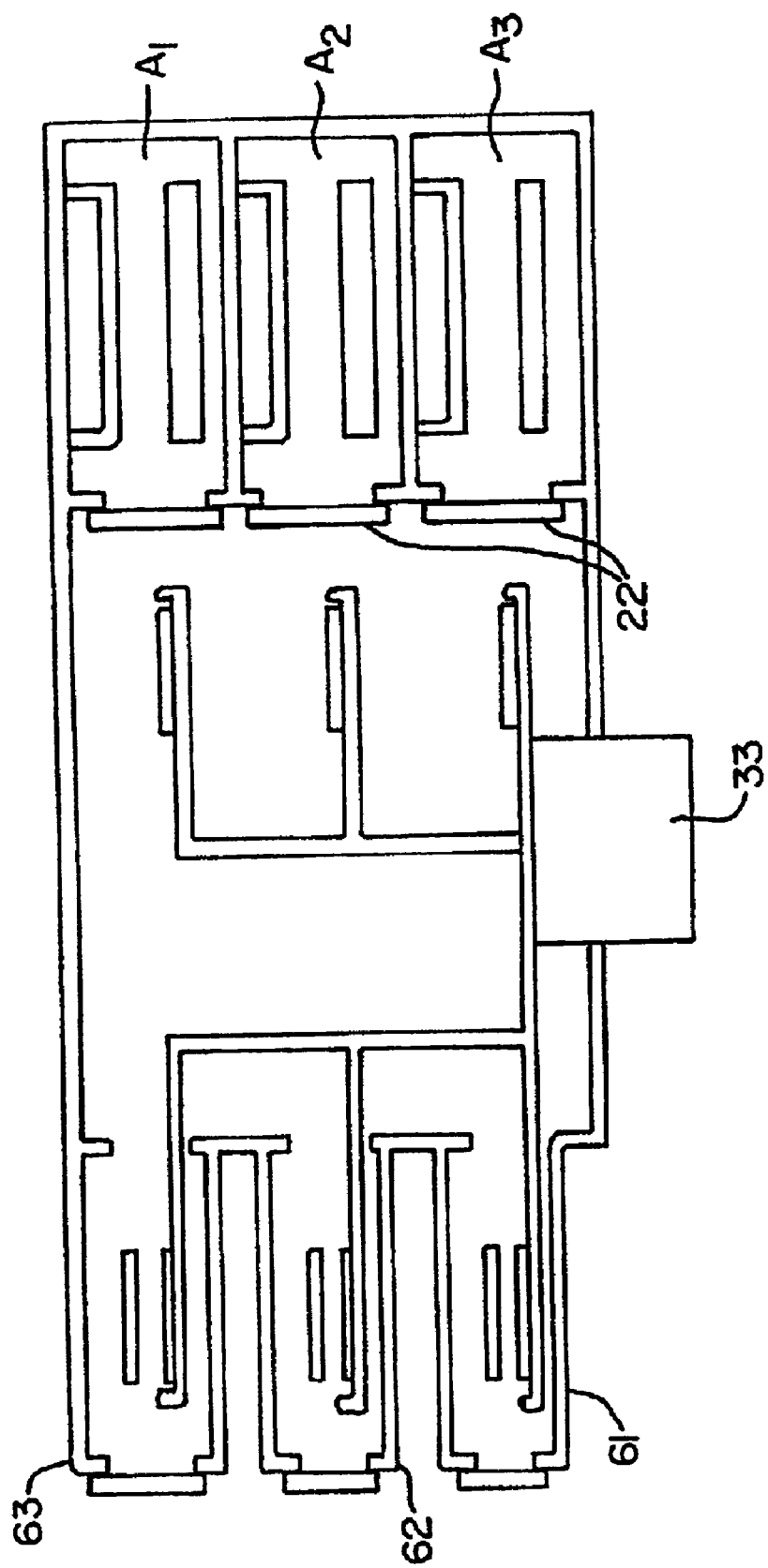
FIG. 10 is a schematic cross-sectional view of a multideck system in which three chambers are vertically arranged.

FIG. 10 illustrates another embodiment of the invention in which three processing chambers A1, A2 and A3 are disposed one above the other. The components shown in FIG. 10 correspond to those described in conjunction with FIG. 1, but an additional processing chamber A3 is provided. In addition, to reduce the pumping and venting time required by large loadlocks, a group of smaller loadlocks 61, 62, and 63 is used. These loadlocks contain fewer wafers than a cassette, for example, two wafers. During the processing of the second wafer, the first wafer cools and is returned to a cassette, and a third wafer introduced. The use of smaller multiple loadlocks permits servicing by an external robot (not shown) and cassettes because the smaller loadlock chamber can be more quickly pumped down to the required low pressure level. In this way cooling of the wafers occurs in the individual loadlocks without changing the throughput of the system.

One concern in a multideck system, such as described herein, is servicing of the chambers. In typical wafer processing chambers, the top of the chamber can be removed to enable cleaning of the interior of the chamber. For a two chamber system, such as shown in FIG. 1, a second service port may be provided for the lower chamber. In another embodiment, the chambers are hinged so that the top chamber can be pivoted or moved out from above the lower chamber, enabling both to be serviced. This design would be suitable for both the two or three chamber system described above.

Alternatively, the chambers can be made removable from the wafer transfer chamber. Typically, the multideck chambers will be bolted, or otherwise connected to the wafer transfer chamber, and positioned on rails, swing arms, hinges or other supporting means to be moved away from the wafer transfer chamber. Depending upon the operational requirements, spare processing chambers may be substituted for the chambers being cleaned, or the chambers may be removed, cleaned, and then returned.

Some embodiments of this invention enables the overall throughput of a single wafer processing system to be doubled or tripled, or further increased, yet consumes no additional floor area in the fab. Furthermore, some embodiments enable a group of single wafer processing chambers to share gas lines, power supply, vacuum pumps, and other expensive equipment. At the same time, when used with single wafer processing equipment, embodiments of this invention permits processing of individual wafers, resulting in a more optimal process condition, with only one wafer being ruined if a problem occurs.

The system described has many advantages over some previously known wafer processing systems, including some previously known multiple wafer processing systems in which multiple wafers are processed in a single chamber. Handling two or more wafers at once at least doubles the throughput without increasing the footprint of the overall system. Using the RF, gas delivery, and vacuum splitting techniques provides a lower cost per chamber, yet at the same time provides the quality and reliability of single wafer processing.

In the above embodiments, the term "flow divider" is used generally to refer to a device that divides a single gas flow into two or more gas flows, and the "flow controller" is used generally to refer to a device that controls a particular gas flow without dividing the gas flow. This term distinction has been made merely for illustrative convenience and should not be used otherwise, e.g., for claim interpretation purposes.

Figure 11:
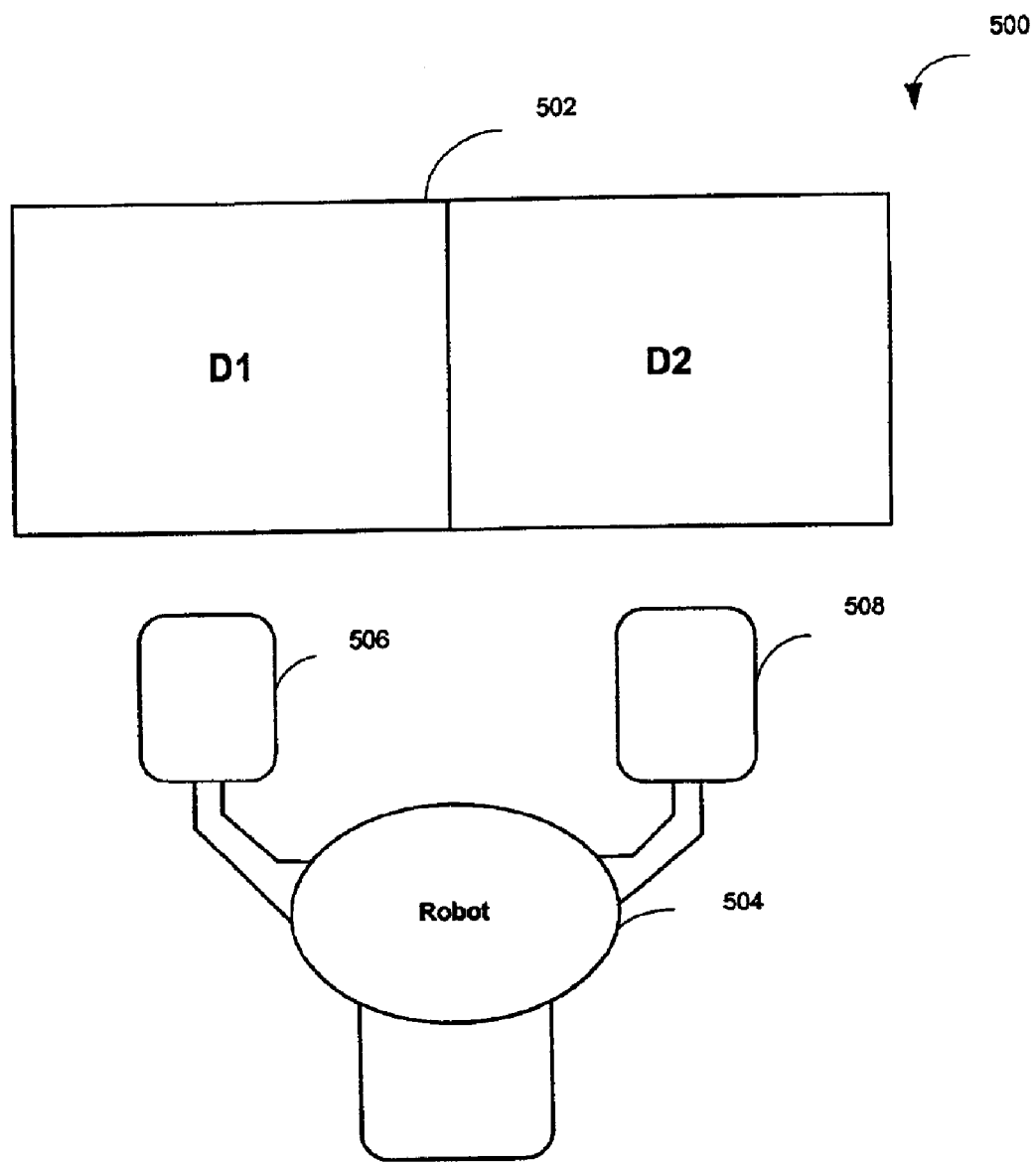
FIG. 11 is a schematic top view of a processing system in which two process chambers are arranged horizontally.

The foregoing description of various embodiments of the invention has been provided for the purposes of understanding of the invention. The description is not intended to be exhaustive, or to limit the invention to precise forms described. For example, FIG. 11 illustrates a schematic top view of a chamber system 500 with a first chamber set 502 including a first chamber D1 and a second chamber D2 provided side by side. A second chamber set (not shown) is provided below first chamber set 502. As with the chambers A1 and A2 described above, chambers D1 and D2 may share the same gas supply, vacuum pump, and the like. Also wafer throughput may be increased without increasing the footprint of the overall system. Chamber system 500 includes a robot 504 having a first wafer blade 506 and a second wafer blade 508 to service chambers D1 and D2 simultaneously. Robot 504 also is provided with vertical movements to service the second chamber set (not shown) that is provided below the first chamber set 502. Moreover, chamber D1 or D2, or both may be configured to process simultaneously more than one wafer. Accordingly, numerous modifications and variations are possible in view of the teachings above.

What is claimed is:

1. A system for processing substrates, comprising:
   a first process chamber configured to perform a given process on a first substrate;
   a second process chamber configured to perform the same process as the first chamber on a second substrate;
   a gas source system configured to output a process gas comprising gases from at least two different gas sources;
   a gas flow system including:
      a flow channel coupled to the gas source system and the first and second process chambers to provide the process gas into the first and second process chambers; and
      a gas flow controller to regulate flow rates of the process gas provided into the first and second chambers in order to provide the first and second substrates with substantially uniform process results, wherein the gas flow controller includes:
   a controller input port;
   an elastic channel coupled to the controller input port;
   a controller output port coupled to the elastic channel; and
   a flow regulator coupled to the elastic channel and being configured to apply a selected pressure on the elastic channel to regulate a flow rate of the process gas flowing through the elastic channel.

2. A system for processing substrates, comprising:
   a first process chamber configured to perform a given process on a first substrate;
   a second process chamber configured to perform the same process as the first chamber on a second substrate;
   a gas source system configured to output a process gas comprising gases from at least two different gas sources;
   a gas flow system including:
      a flow channel coupled to the gas source system and the first and second process chambers to provide the process gas into the first and second process chambers; and
      a gas flow controller to regulate flow rates of the process gas provided into the first and second chambers in order to provide the first and second substrates with substantially uniform process results, wherein the gas flow controller includes:
   first and second controller input ports;
   first and second elastic channels coupled to the first and second controller input ports, respectively;
   first and second controller output ports coupled to the first and second elastic channels, respectively; and first and second flow regulators coupled to the first and second elastic channels, respectively, and being configured to apply selected pressures on the respective elastic channel to regulate a flow rate of the process gas flowing through the respective elastic channel.

3. The system of claim 1 or 2 wherein the process gas is flowing into the first and second chambers at first and second input flow rates, respectively, and the gas flow controller is used to regulate the first and second flow rates.

4. The system of claim 3 wherein the first and second flow rates are set according to results obtained from a previous substrate process.

5. The system of claim 1 or 2 wherein the first process chamber is stacked over the second process chamber.

6. The system of claim 5 further comprising:
a cathode assembly that is shared by the first and second chambers; and
a vacuum pump that is shared by the first and second chambers.

7. The system of claim 1 or 2 wherein the first and second process chambers are provided with substantially the same chamber configuration including the location of a gas input port.

8. The system of claim 7 wherein the process performed in the first and second chamber is one selected from the group consisting of a plasma enhanced deposition, pad etch, etch back, and spacer etch processes.

9. A system for processing substrates, comprising:
a first process chamber configured to perform a given process;
a second process chamber configured to perform the same process as the first chamber and provided over the first process chamber;
a gas source including a process gas comprising gases from at least two different gas sources;
a gas flow system having a flow channel coupled to the gas source and the first and second process chambers to provide the process gas into the first and second process chambers; and
a gas flow controller system including:
a first input port to receive the process gas,
a first extending channel coupled to the first input port,
a first output port coupled to the first extending channel and configured to output the process gas to the first process chamber,
a first flow controller coupled to the first extending channel to regulate a flow rate of the process gas flowing through the first extending channel, and
a first secondary flow controller coupled to the first output port to receive the process gas and divide the process gas into multiple gas flows.

10. A system for processing substrates, comprising:
a first process chamber configured to perform a given process;
a second process chamber configured to perform the same process as the first chamber;
a gas source including a process gas comprising gases from at least two different gas sources;
a gas flow system having a flow channel coupled to the gas source and the first and second process chambers to provide the process gas into the first and second process chambers; and
a gas flow controller system including:
a first input port to receive the process gas,
a first extending channel coupled to the first input port,
a first output port coupled to the first extending channel,
a first primary flow controller coupled to the first extending channel to regulate a flow rate of the process gas flowing through the first extending channel, and
a first secondary flow controller coupled to the first output port to receive the process gas and divide the process gas into multiple gas flows, wherein the multiple gas flows include a first gas flow and a second gas flow.

11. The system of claim 10, the gas flow controller system further comprising:
a second secondary flow controller coupled to the first output port to receive the process gas and divide the process gas into additional multiple gas flows, wherein the additional multiple gas flows include a third gas flow and a gas flow.

12. A system for processing substrates, comprising:
a first process chamber configured to perform a given process on a first substrate;
a second process chamber configured to perform the same process as the first chamber on a second substrate;
a gas flow control system including:
a first input port adapted to receive a process gas comprising gases from at least two different gas sources,
a primary flow controller coupled to the first input port to regulate a flow rate of the process gas flowing through the first input port,
a first output port coupled to the primary flow controller, and
a secondary flow controller coupled to the first output port to receive the process gas and divide the process gas into a first plurality of gas flows, wherein the multiple gas flows include a first gas flow and a second gas flow.

13. A system for processing substrates, comprising:
a first process chamber configured to perform a given process on a first substrate;
a second process chamber configured to perform the same process as the first chamber on a second substrate, the second process chamber sharing a common vacuum pumping system with the first process chamber;
a gas flow control system comprising:
a primary flow divider adapted to receive a process gas comprising gases from at least two different gas sources and divide the process gas into a first plurality of gas flows,
a gas flow controller coupled to a first output of the primary flow divider and adapted to control a flow rate of a first gas flow selected from the first plurality of gas flows, and
a secondary flow divider coupled to an output of the gas flow controller and adapted to divide the first gas flow into a second plurality of gas flows.

14. The system of claim 13, the gas flow control system further comprising:
a second gas flow controller coupled to a second output of the primary flow divider and adapted to control a flow rate of a second gas flow selected from the first plurality of gas flows, and
a tertiary flow divider coupled to an output of the second gas flow controller and adapted to divide the second gas flow into a third plurality of gas flows.

15. The system of claim 14 wherein the flow rate of the first gas flow and the flow rate of the second gas flow are set according to results obtained from a previous substrate process.

* * * * *